(12) United States Patent
Freno et al.

(10) Patent No.: US 10,947,820 B2
(45) Date of Patent: Mar. 16, 2021

(54) SIMULATING HYDRAULIC FRACTURE PROPAGATION USING DYNAMIC MESH DEFORMATION

(71) Applicant: Halliburton Energy Services, Inc., Houston, TX (US)

(72) Inventors: Brian A. Freno, Albuquerque, NM (US); Srinath Madasu, Houston, TX (US); Avi Lin, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 306 days.

(21) Appl. No.: 15/762,379

(22) PCT Filed: Nov. 12, 2015

(86) PCT No.: PCT/US2015/060356
§ 371 (c)(1),
(2) Date: Mar. 22, 2018

(87) PCT Pub. No.: WO2017/082909
PCT Pub. Date: May 18, 2017

(65) Prior Publication Data
US 2018/0274337 A1 Sep. 27, 2018

(51) Int. Cl.
*E21B 41/00* (2006.01)
*E21B 43/26* (2006.01)
(Continued)

(52) U.S. Cl.
CPC .......... *E21B 41/0092* (2013.01); *E21B 43/26* (2013.01); *E21B 49/00* (2013.01); *E21B 49/08* (2013.01)

(58) Field of Classification Search
CPC ...... E21B 41/0092; E21B 43/26; E21B 49/00; E21B 49/08
(Continued)

(56) References Cited

U.S. PATENT DOCUMENTS

| 2003/0020732 A1* | 1/2003 | Jasa | ........................ G06T 5/006 |
| | | | 345/645 |
| 2005/0236152 A1* | 10/2005 | Siebrits | ................... E21B 43/26 |
| | | | 166/250.1 |

(Continued)

FOREIGN PATENT DOCUMENTS

WO 2017082909 A1 5/2017

*Primary Examiner* — Justin C Mikowski
(74) *Attorney, Agent, or Firm* — John Wustenberg; Parker Justiss, P.C.

(57) ABSTRACT

An illustrative hydraulic fracturing simulation method includes: creating an initial mesh representation of a subterranean formation, the mesh including mesh nodes; determining one or more fracture paths in the formation; for each of the one or more fracture paths, displacing a subset of the mesh nodes into alignment with the fracture path; interpolating from displacements of the aligned mesh nodes to obtain displacements for each non-aligned mesh node in the mesh, thereby obtaining a deformed mesh representation of the formation; using the deformed mesh to construct a linear set of equations representing fracture creation and propagation caused by injection of a hydraulic fracturing fluid; deriving one or more fracture path extensions from the linear set of equations; and displaying the one or more fracture paths with the one or more fracture path extensions accurately representing the fracture propagation path. The interpolation may be performed using radial basis functions.

20 Claims, 4 Drawing Sheets

(51) Int. Cl.
  *E21B 49/00* (2006.01)
  *E21B 49/08* (2006.01)
(58) Field of Classification Search
  USPC .............................................. 703/2
  See application file for complete search history.

(56) References Cited

U.S. PATENT DOCUMENTS

| | | |
|---|---|---|
| 2009/0119082 A1 | 5/2009 | Fitzpatrick et al. |
| 2012/0026167 A1 | 2/2012 | Ran et al. |
| 2012/0215513 A1 | 8/2012 | Branets et al. |
| 2013/0073272 A1* | 3/2013 | Wallace ............... E21B 43/00 703/10 |
| 2015/0260017 A1 | 9/2015 | Ding et al. |
| 2018/0348401 A1* | 12/2018 | Imhof .................. G06T 17/05 |

* cited by examiner

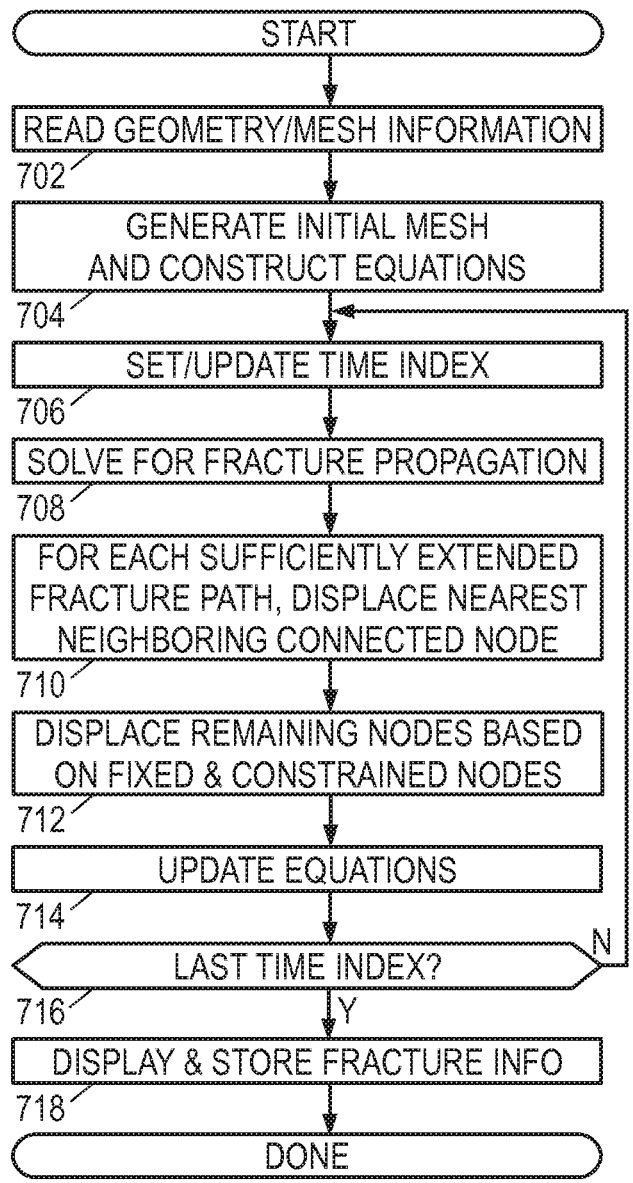

SIMULATING HYDRAULIC FRACTURE PROPAGATION USING DYNAMIC MESH DEFORMATION

CROSS-REFERENCE TO RELATED APPLICATION

This application is the National Stage of, and therefore claims the benefit of, International Application No. PCT/US2015/060356 filed on Nov. 12, 2015, entitled "SIMULATING HYDRAULIC FRACTURE PROPAGATION USING DYNAMIC MESH DEFORMATION," which was published in English under International Publication Number WO 2017/082909 on May 18, 2017. The above application is commonly assigned with this National Stage application and is incorporated herein by reference in its entirety.

BACKGROUND

Unconventional reservoirs often have a low-permeability rock matrix that impedes fluid flow, making it difficult to extract hydrocarbons (or other fluids of interest) at commercially feasible rates and volumes. Fortunately, the effective permeability of the formation can be increased by hydraulic fracturing. When the rock matrix is exposed to a high-pressure high-volume flow of a relatively incompressible fluid, the low permeability causes sharp gradients in the formation's stress field, forcing integrity failures at the relatively weakest points of the rock matrix. Such failures often occur as sudden "cracking" or fracturing of the matrix that momentarily reduces the stress gradient until it can be rebuilt by the intruding fluid flow. As the high-pressure flow continues, the fractures may propagate, for example, as an intermittent series of small cracks. The injected fluid also deforms and shifts blocks of matrix material, further complicating the fracture propagation analysis.

Oilfield operators generally desire to provide a relatively even distribution of fractures throughout the reservoir while avoiding overlap in the fractures connecting to different wells or different production zones in a single well. (Such overlaps prevent operators from applying a pressure differential across the region between the overlapping fracture families, dramatically reducing the rate and efficiency at which fluid can be drained from that region. Conversely, an uneven distribution of fractures leaves regions of low permeability that similarly cannot be drained effectively.) Thus, operators seek to induce fracturing with carefully controlled fracture reach ("extent"). Inaccuracies in predicting and controlling fracture extent significantly impair the efficiency and rate at which fluids can be recovered from the formation.

Unfortunately, only limited computational resources are available for modeling hydraulic fracture propagation and the formation of the fracture network, so the modeling accuracy is similarly limited.

BRIEF DESCRIPTION OF THE DRAWINGS

Accordingly, the drawings and the following description disclose simulation systems and methods that model hydraulic fracture propagation using dynamic mesh deformation. Such deformation enables increased accuracy without significantly increasing computational resource requirements. In the drawings:

FIG. 7 is a flow diagram of an illustrative hydraulic fracture modeling method.

Figure 1:
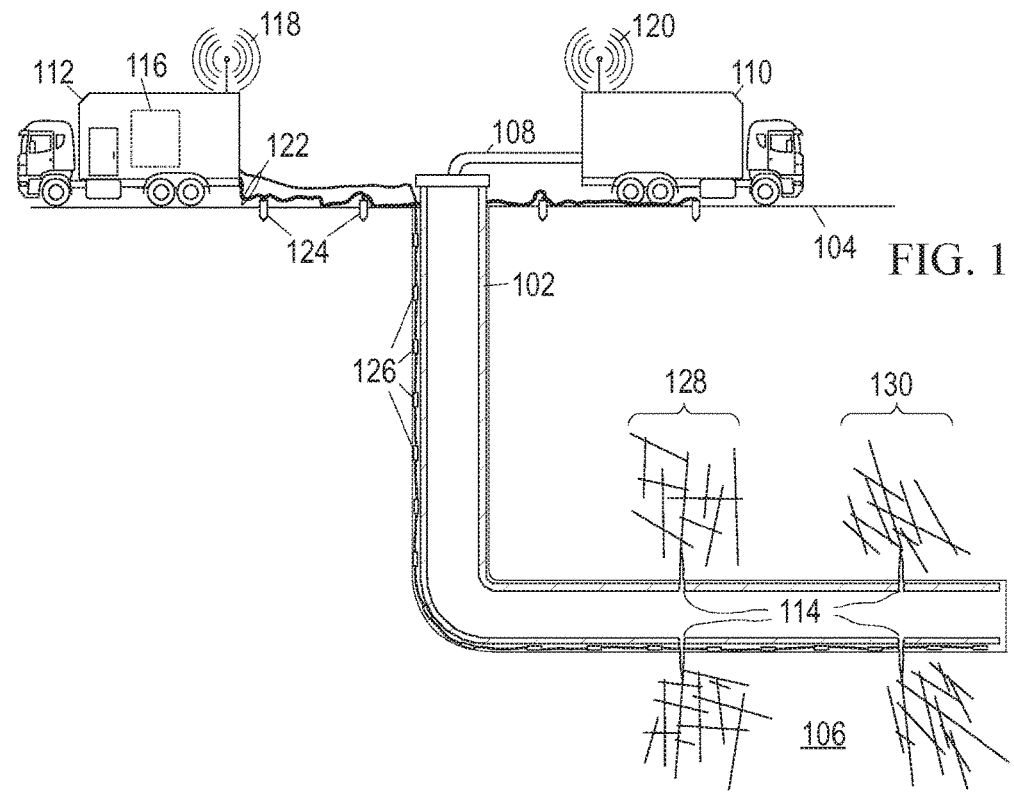
FIG. 1 is an environmental view of an illustrative hydraulic fracturing operation.

It should be understood, however, that the specific embodiments given in the drawings and detailed description do not limit the disclosure. On the contrary, they provide the foundation for one of ordinary skill to discern the alternative forms, equivalents, and modifications that are encompassed together with one or more of the given embodiments in the scope of the appended claims.

DETAILED DESCRIPTION

The disclosed hydraulic fracture modeling systems and methods are best understood in context. We begin here with a discussion of an illustrative hydraulic fracturing operation to which the disclosed systems and methods have been applied. FIG. 1 shows the environment of an illustrative hydraulic fracturing operation. A wellbore 102 extends from the surface 104 into a subterranean region 106. Typically, the subterranean region includes a reservoir that contains hydrocarbons or other resources such as, e.g., oil. As another example, the subterranean region 106 may include all or part of a rock formation (e.g., shale, coal, sandstone, granite, or others) that contains natural gas. The subterranean region 106 may include naturally fractured rock or natural rock formations that are not fractured to any significant degree. When the subterranean region 106 includes tight gas formations (i.e., natural gas trapped in low permeability rock such as shale), it is typically desirable to create additional fractures in the formation to increase the formation's effective permeability.

Accordingly, FIG. 1 also shows an injection assembly coupled to supply a high-pressure, high-volume fluid flow via a conduit 108 to the wellbore 102. The injection assembly includes one or more pump trucks 110 and instrument trucks 112 that operate to inject fluid via the conduit 108 and the wellbore 102 into the subterranean region 106, thereby opening existing fractures and creating new fractures. The fluid reaches the formation via one or more fluid injection locations 114, which in many cases are perforations in the casing of wellbore 102. Such casing may be cemented to the wall of the wellbore 102, though this is not a requirement. In some implementations, all or a portion of the wellbore 102 may be left open, without casing. The conduit 108 may include an injection manifold and feed pipe, as well as piping internal to the wellbore such as a work string, coiled tubing, sectioned pipe, or other types of conduit.

The fracture treatment may employ a single injection of fluid to one or more fluid injection locations 114, or it may employ multiple such injections, optionally with different fluids. Where multiple fluid injection locations 114 are employed, they can be stimulated concurrently or in stages. Moreover, they need not be located within the same wellbore 102, but may for example be distributed across multiple wells or multiple laterals within a well. An injection treatment control subsystem 116 coordinates operation of the injection assembly components (pump trucks, feed tanks, throttles, valves, flow sensors, pressure sensors, etc.) to monitor and control the fracture treatment. Though shown as being localized to a single instrument truck 112, the control subsystem 116 may in practice take the form of multiple data acquisition and processing subsystems optionally distributed throughout the injection assembly and wellbore 102, as well as remotely coupled offsite computing facilities available via communication links and networks. Though the computing subsystem is described below as a separate entity for implementing hydraulic fracture modeling, some contemplated embodiments of the injection treatment control subsystem 116 have the simulator as an integrated component.

The pump trucks 110 can include mobile vehicles, immobile installations, skids, hoses, tubes, fluid tanks, fluid reservoirs, pumps, valves, mixers, or other types of structures and equipment. They supply treatment fluid and other materials (e.g., proppants, cross linked gels, linear gels, surfactants, breakers, stop-loss materials) for the injection treatment. The illustrated pump trucks 110 communicate treatment fluids into the wellbore 102 at or near the level of the ground surface 104. The pump trucks 110 are coupled to valves and pump controls for starting, monitoring, stopping, increasing, decreasing or otherwise controlling pumping as well as controls for selecting or otherwise controlling fluids pumped during the injection treatment.

The instrument trucks 112 can include mobile vehicles, immobile installations, or other suitable structures and sensors for measuring temperatures, pressures, flow rates, and other treatment and production parameters. The example instrument trucks 112 shown in FIG. 1 include an injection treatment control subsystem 116 that controls or monitors the injection treatment applied by the injection assembly. The injection assembly may inject fluid into the formation above, at, or below a fracture initiation pressure; above, at, or below a fracture closure pressure; or at another fluid pressure.

Communication links 118, 120 enable the instrument trucks 112 to communicate with the pump trucks 110 and other equipment at the ground surface 104. Additional communication links 122 enable the instrument trucks 112 to communicate with sensors or data collection apparatus in the wellbore 102, other wellbores, remote facilities, and other devices and equipment. The communication links can include wired or wireless communications assemblies, or a combination thereof. FIG. 1 shows communication links 122 for an array of surface seismic sensors 124 and an array of downhole seismic sensors 126 for detecting and locating microseismic events. Though downhole sensors 126 are shown as being positioned in the injection well, they can also or alternatively be located in one or more nearby monitoring wells. Sensors 124 and/or 126 detect seismic energy from the microseismic events that occur as fractures are formed and propagated. The received energy signals from the sensors are processed by the control subsystem 116 to determine the microseismic event locations, times, and magnitudes. As discussed further below, such information is indicative of the fracture locations and dimensions, which information may be used to determine when the fracturing operations should be terminated and how to carry out subsequent operations to achieve the desired results.

The injection treatment control subsystem 116 may include data processing equipment, communication equipment, and other equipment for monitoring and controlling injection treatments applied to the subterranean region 106 through the wellbore 102. The injection treatment control subsystem 116 may be communicably linked to a remote computing facility that can calculate, select, or optimize treatment parameters for initiating, opening, and propagating fractures of the desired extent. The injection treatment control subsystem 116 may receive, generate or modify an injection treatment plan (e.g., a pumping schedule) that specifies properties of an injection treatment to be applied to the subterranean region 106. Based on such modeled behavior results, the injection treatment control subsystem 116 shown in FIG. 1 controls operation of the injection assembly.

FIG. 1 shows that an injection treatment has fractured the subterranean region 106, producing first and second fracture families 128, 130 from respective perforations 114. The induced fractures may extend through naturally fractured rock, regions of un-fractured rock, or both. The injected fracturing fluid can flow from the induced fractures into the natural fracture networks, into the rock matrix, or into other locations in the subterranean region 106 (e.g., faults, voids). The injected fracturing fluid can, in some instances, dilate or propagate the natural fractures or other pre-existing fractures in the rock formation. The formation and propagation of fractures produces microseismic events, which may be identified and located based on analysis of the signals from sensors 124 and 126. The progression of the fracturing operation can thus be monitored and such monitoring used to derive information useful for modeling the fracture networks that have been formed and which may be formed in future fracturing operations in the region.

In some implementations, the control subsystem 116 collects and analyzes the signals from sensors 124, 126 to monitor fracture extents and to control the fluid injection parameters to bring the achieved fracture extent as close as possible to a target value. For example, the injection treatment control subsystem 116 can modify, update, or generate a fracture treatment plan (pumping rates, pressures, fluid compositions) based on the fracture extents derived from microseismic monitoring of the ongoing treatment, where it becomes imperative to employ highly adaptive computational algorithms that deliver high fidelity results with minimal consumption of computation resources, i.e., CPU time and memory requirements. As another example, fracture growth models derived from previous fracturing operations may provide predictions of fracture propagation rates and extents based on a proposed pumping schedule or other aspects of a formation treatment plan for subsequent operations in the field.

Some of the techniques and operations described herein may be implemented by one or more computing assemblies configured to provide the functionality described. In various instances, a computing assembly may include any of various types of devices, including, but not limited to, handheld mobile devices, tablets, notebooks, laptops, desktop computers, workstations, mainframes, distributed computing networks, and virtual (cloud) computing systems.

Figure 2:
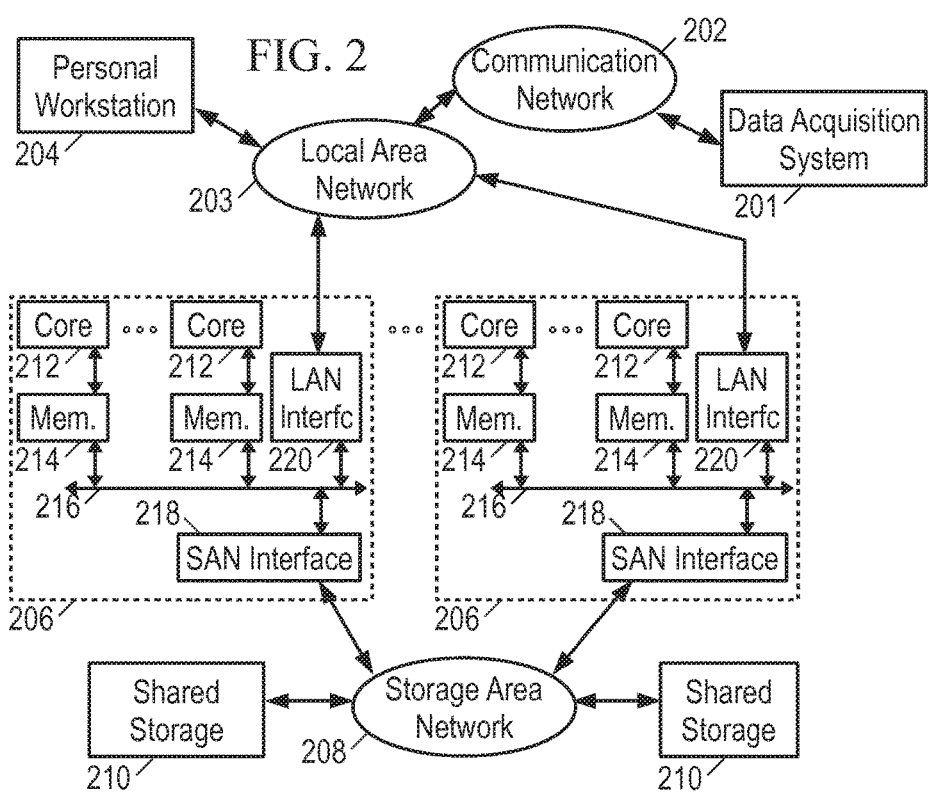
FIG. 2 is a block diagram of an illustrative hydraulic fracture modeling system.

FIG. 2 shows an illustrative computing subsystem 116 in which a data acquisition system 201 represents the instrument trucks 112 and other sources of data regarding the well and surrounding formations. A communications network 202 (such as, e.g., the internet or other communications link for transferring digital data) couples the data acquisition system 201 to a local area network (LAN) 203 to communicate the data to a personal workstation 204. The data can include treatment data, geological data, fracture data, fluid data, or other types of data. Workstation 204 may take the form of a desktop computer having a user interface (e.g., keyboard, mouse, and display) that enables the user to interact with the other elements of the computing subsystem, e.g., by entering commands and viewing responses. In this fashion, the user is able to retrieve the well data and make it available for simulation of flow in a network of fractures.

Workstation 204 may lack sufficient internal resources to perform such processing in a timely fashion. The LAN 203 further couples the workstation 204 to one or more multi-processor computers 206, which are in turn coupled via a storage area network (SAN) 208 to one or more shared storage units 210. LAN 203 provides high-speed communication between multi-processor computers 206 and with personal workstation 204. The LAN 204 may take the form of an Ethernet network.

Multi-processor computer(s) 206 provide parallel processing capability to enable suitably prompt processing of the microseismic and fracture growth modeling data. Each computer 206 includes multiple processors 212, distributed memory 214, an internal bus 216, a SAN interface 218, and a LAN interface 220. Each processor 212 operates on allocated tasks to solve a portion of the overall problem and contribute to at least a portion of the overall results. Associated with each processor 212 is a distributed memory module 214 that stores application software and a working data set for the processor's use. Internal bus 216 provides inter-processor communication and communication to the SAN or LAN networks via the corresponding interfaces 218, 220. Communication between processors in different computers 206 can be provided by LAN 204 or via a mailbox mechanism on storage devices 210.

SAN 208 provides low-latency access to shared storage devices 210. The SAN 208 may take the form of, e.g., a Fibrechannel or Infiniband network. Shared storage units 210 may be large, stand-alone information storage units that employ magnetic disk media for nonvolatile data storage. Other suitable forms of nontransitory information storage media can also be employed. To improve data access speed and reliability, the shared storage units 210 may be configured as a redundant disk array ("RAID").

It is the software that configures the various parts of the computing subsystem 116 to coordinate and collectively operate as a hydraulic fracture modeling system. One or more commercially available software packages and libraries may be installed in the computer assembly to provide the functionality for solving linear systems. User-authored programs, functions, scripts, workflows, or other programming mechanisms may be employed to customize the operation of the software and automate certain operations such as those outlined below for formulating reservoir formation models and simulating fracture propagation. The applications software may include a fracture mapping module, mesh fitting module, an equation construction module, an equation solving module, a user interface module, and other function modules, each implemented in the form of machine-readable instructions. Examples of commercially available software that support the use of such programming include C, C++, C++ AMP, D, Erlang, Python and Fortran. The computing subsystem 110 can be preprogrammed or can be programmed (and reprogrammed) by loading a program from another source (e.g., from a CD-ROM, from another computer device through a data network, or in another manner). Nevertheless, the implementation of the following methods is not limited to any specific software language or execution environment.

Figure 3:
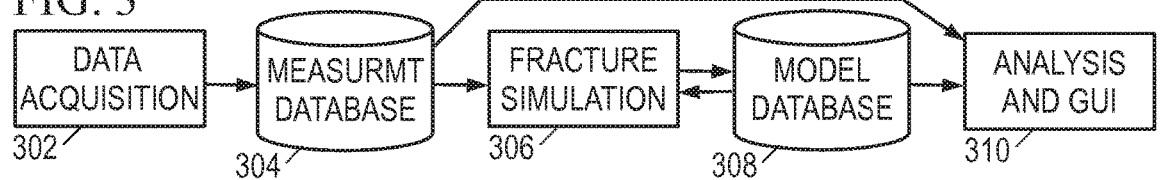
FIG. 3 is a diagram of an illustrative modeling software architecture.

The software operating on the computing subsystem 116 may be structured as indicated by the software architecture shown in FIG. 3. A data acquisition module 302 stores various types of data in a measurement database 304. The measurement database may include treatment data relating to injection treatment plans. For example the treatment data can indicate a pumping schedule, parameters of a previous injection treatment, parameters of a future injection treatment, or parameters of a proposed injection treatment. Such parameters may include information on flow rates, flow volumes, slurry concentrations, fluid compositions, injection locations, injection times, or other parameters.

The measurement database may further include geological data relating to geological properties of a subterranean region. For example, the geological data may include information on wellbores, completions, or information on other attributes of the subterranean region. In some cases, the geological data includes information on the lithology, fluid content, stress profile (e.g., stress anisotropy, maximum and minimum horizontal stresses), pressure profile, spatial extent, natural fracture geometries, or other attributes of one or more rock formations in the subterranean zone. The geological data can include information collected from well logs, rock samples, outcroppings, microseismic imaging, tilt measurements, or other data sources.

The measurement database may still further include fluid data relating to well fluids and entrained materials. The fluid data may identify types of fluids, fluid properties, thermodynamic conditions, and other information related to well assembly fluids. The fluid data can include flow models for compressible or incompressible fluid flow. For example, the fluid data can include coefficients for systems of governing equations (e.g., Navier-Stokes equations, advection-diffusion equations, continuity equations, etc.) that represent fluid flow generally or fluid flow under certain types of conditions. In some cases, the governing flow equations define a nonlinear system of equations. The fluid data can include data related to native fluids that naturally reside in a subterranean region, treatment fluids to be injected into the subterranean region, hydraulic fluids that operate well assembly tools, or other fluids that may or may not be related to a well assembly.

Simulation software 306 (including the fracture mapping, mesh fitting, equation construction, and solving modules mentioned above) employs the information from the measurement database 304 to locate and model the propagation of induced fractures. The mesh and fracture properties are stored in model database 308. The mesh and fracture properties may a mapping of mesh nodes to fractures and displacement information for the remaining nodes, as discussed further below. A visualization and analysis module 310 generates visual representations of the fractures and measurements for an operator, generally in an interactive form that enables the operator to enhance portions of the model and derive analytical results therefrom. The visual representation may depict spatial distributions of values and/or integrated values such as injected volumes, flow rates, fracture dimensions, and estimated permeabilities. In some contemplated embodiments, the analysis module further produces recommendations for real-time modifications to treatment plans that are underway.

We turn now to a discussion of certain fracture propagation modeling details. The hydraulic fracturing operations produce complex fracture networks that pose steep requirements for computational modeling physical phenomena (such as crack propagation and fluid-structure interactions) to the desired accuracy. One of the challenges associated with developing computational models is discretization of the spatial domain where the computer accounts for and distinguishes between the fluid and solid regions, which vary with respect to time.

Figure 4A:
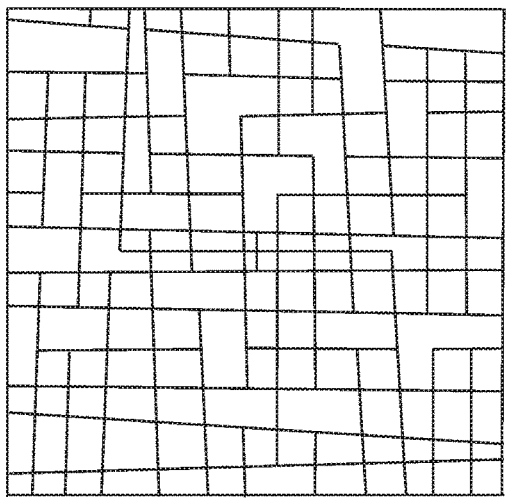
FIGS. 4A-4B are mesh representations of a fracture network.

One approach disclosed by Bai and Lin in "Tightly coupled fluid-structure interaction computation algorithm for hydraulic fracturing simulations", 48th US Rock Mechanics Symposium Minneapolis, 2014 (ARMA 14-7258), is to model the domain of the fracture network using a pre-determined mesh as shown in FIG. 4A. The faces of the mesh correspond to the rock, while the edges correspond to the (potential) fractures. As aspects of the fluid mechanics are simulated in the presence of a rock stress distribution, fractures are initiated, opened, and/or extended along the predefined static edges of the mesh. The mesh is static, meaning that the potential fracture locations and orientations remain fixed. In other words, the simulation software inherently constrains the directions and rates of fracture propagation. Perhaps unsurprisingly, the initial mesh choice strongly influences the fracture propagation trajectory, oftentimes in a fashion that is unlikely to be representative of the physical system.

Figure 4B:
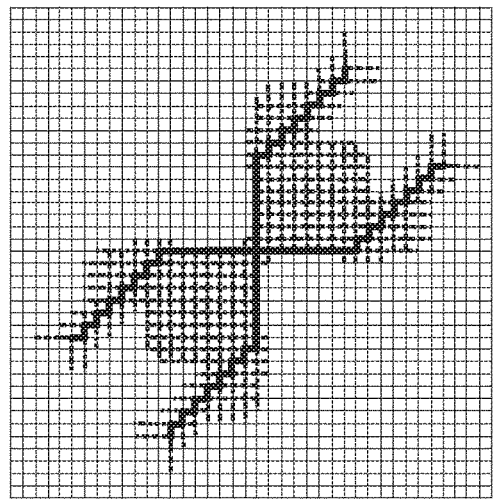

For propagation along a general direction not aligned with the mesh edges, the mesh must be especially fine to capture the fracture path with the accuracy required by the user. FIG. 4B shows a much finer, uniform mesh (also drawn from Bai and Lin). Heavy solid lines represent four primary fracture paths emanating outward from one injection point. The primary fracture paths result from tensile failure, while heavy broken lines represent the secondary network of fracture paths formed by shear failure. However, the finer mesh substantially increases the number of unknowns in the simulated domain and hence greatly increases the computational requirements.

Figure 5:
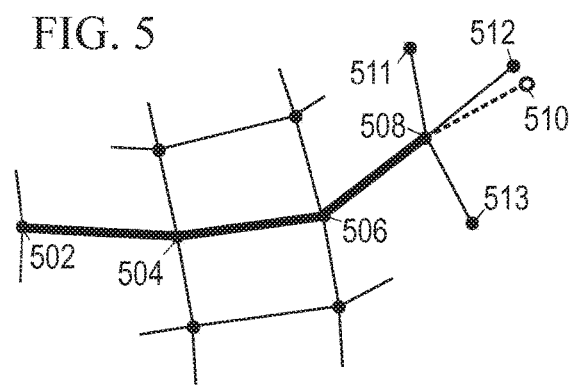
FIG. 5 is a node model diagram of a propagating fracture.

This challenge is resolved herein through the use of a dynamic, deformable mesh. FIG. 5 shows a portion of a deformable mesh representing a fracture in the form of edges between a sequence of nodes 502, 504, 506, 508. As the fracture propagates, edges and nodes are added sequentially at a distance and direction that are determined by the governing physics equations rather than the mesh. Thus, for example, if the equations indicate that the illustrated fracture should propagate from node 508 to a new node at position 510 over a given period of time, the mesh will be deformed as needed to locate one of the connected nodes 511, 512, or 513 at position 510. Preferentially, the nearest connected node 512 is chosen and relocated accordingly, though some embodiments also account for other factors such as balancing the distribution of other nodes.

Thus, this technique models the fracture paths without modifying the existing connectivity of the mesh, conforming to reality as closely as possible. The structure of the sparse computational matrix associated with the physical equations remains the same, as does the approach to populating the sparse matrix.

At least some embodiments perform the mesh deformation using meshless interpolation that preserves the topology and connectivity of the initial mesh and is therefore relatively inexpensive computationally. Indeed, the meshless interpolation methods do not computationally require the connectivity information, thereby increasing the simplicity of the interpolation process, and extending the applicability to both structured and unstructured meshes. Though many choices exist for performing the meshless interpolation, the technique is demonstrated here using radial basis function (RBF) interpolation. RBF interpolation is described in detail in de Boer et al., "Mesh deformation based on radial basis function interpolation", Computers & Structures, 85 784-795 (2007).

As discussed by de Boer, RBFs are functions that yield real values depending solely upon the norm of the input variable, x:

$$\phi = \phi(\|x\|). \tag{1}$$

Linear combinations of such functions accordingly provide a convenient way to approximate multivariate functions. In the context of spatial interpolation, the RBFs use a distance norm, such as the "taxicab" norm or the Euclidean norm. Since one of the goals here is to eliminate any dependence on mesh connectivity, we use the Euclidean norm.

Suitable RBF forms include:

| | |
|---|---|
| Gaussian | $\phi(r) = e^{-(\varepsilon r)^2}$ |
| Multiquadratic | $\phi(r) = \sqrt{1 + (\varepsilon r)^2}$ |
| Inverse quadratic | $\phi(r) = \dfrac{1}{1 + (\varepsilon r)^2}$ |
| Inverse multiquadratic | $\phi(r) = \dfrac{1}{\sqrt{1 + (\varepsilon r)^2}}$ |
| Polyharmonic spline | $\phi(r) = \begin{cases} r^k & k = 1, 3, 5, \ldots \\ r^k \ln(r) & k = 2, 4, 6, \ldots \end{cases}$ |
| Thin plate spline | $\phi(r) = r^2 \ln(r)$ |

Note that the parameterized RBFs may require additional tuning to ensure the solvability of the interpolation. On the other hand, the thin plate spline option has several favorable properties: (1) it produces smooth, infinitely differentiable surfaces; (2) there are no free parameters that require manual tuning; (3) scaling does not affect smoothness; and (4) smoothness is optimized. The examples discussed below employ the thin plate spline RBF.

The selected RBF is used to structure an interpolant, s(x), using a set of $N_b$ known function values (in this case, the displacements of deformed mesh nodes from the initial mesh node location), $f(x_i)$, as follows:

$$s(x) = \sum_{i=1}^{N_b} \alpha_i \phi(r_i) + h(x), \tag{2}$$

where $r_i \equiv \|x - x_i\|$ and offset function $h(x,y) \equiv \beta_1 + \beta_2 x + \beta_3 y$. The vectors of coefficients $\alpha$ and $\beta$ are computed from the vector of displacements f as follows:

$$\begin{bmatrix} M & P \\ P^T & 0 \end{bmatrix} \begin{Bmatrix} \alpha \\ \beta \end{Bmatrix} = \begin{Bmatrix} f \\ 0 \end{Bmatrix}, \tag{3}$$

where $M_{ij} \equiv \phi(\|x_i - x_j\|)$ and $$P \equiv \begin{bmatrix} 1 & x_1 & y_1 \\ \vdots & \vdots & \vdots \\ 1 & x_{N_b} & y_{N_b} \end{bmatrix}.$$

Equation (3) arises from the requirement that the coordinates for which the function values are known yield the correct function values. Note that equation (3) is solved independently for each spatial dimension of the displacements— where displacements have both x and y components, equation (3) is used to interpolate the x component, and separately to interpolate the y component of the node displacements.

In constructing the deformed mesh, the boundary nodes are constrained to remain on the boundary while being permitted to move along the boundary. The displacements of the fracture nodes are fixed, while interpolation is used to determine the displacements of the remaining nodes. Whenever the fracture path is extended by a length on the order of the mesh size, an existing node on the mesh is added to the path definition from the connected node candidates. The added node is assigned a fixed displacement and the remaining nodes are re-interpolated.

Figure 6A:
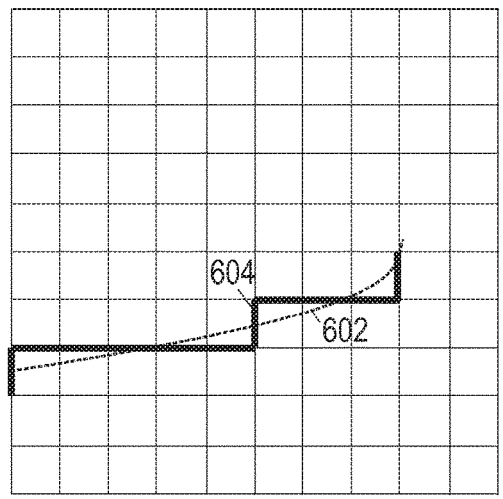
FIG. 6A is a parabolic fracture path represented in a fixed mesh.
Figure 6B:
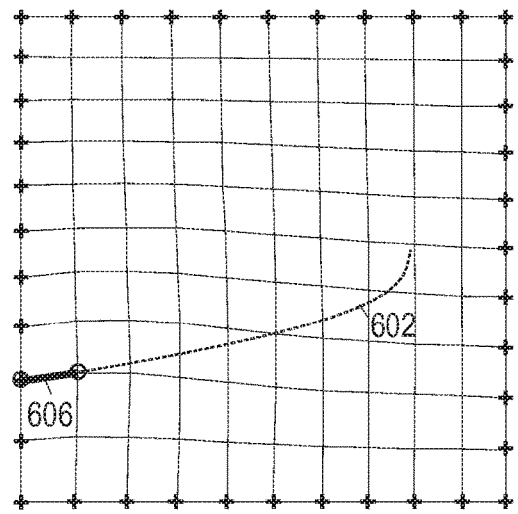
FIGS. 6B-6D are stages of the parabolic fracture path represented in a dynamic mesh.
Figure 6C:
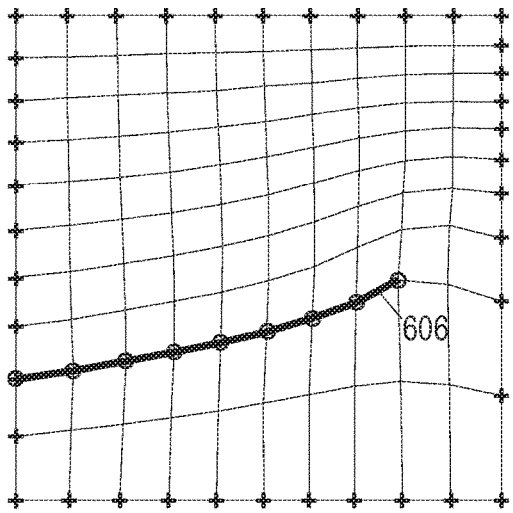
Figure 6D:
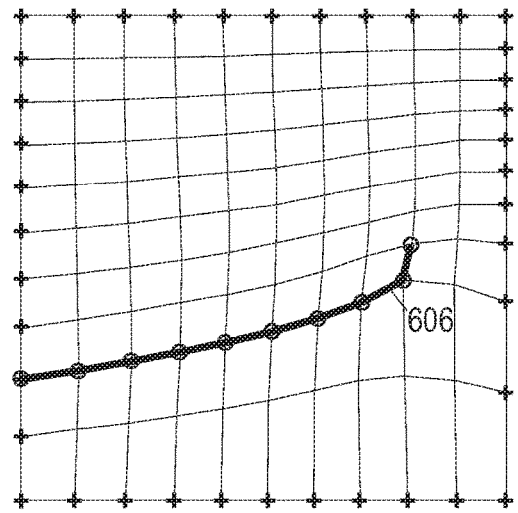

As a demonstration, FIG. 6A shows an illustrative fracture path 602 and a modeled path 604 that best approximates it given the constraints of a fixed initial mesh. FIGS. 6B-6D illustrate stages of the propagating fracture path 606 as represented in a dynamic, deformable mesh. In the deformable mesh, the nodes of modeled path 606 fall precisely along the illustrative fracture path 602, enabling substantially improved modeling accuracy without increasing the number of unknowns.

In view of the foregoing principles and techniques, FIG. 7 presents an illustrative hydraulic fracture modeling method that may be implemented in large part by the previously described computing subsystems. Though the operations of the method are shown and described as being sequential, in practice the operations are expected to occur concurrently and with potentially different orders.

The method begins in block 702 with the simulator module reading the information regarding the spatial properties of the region to be simulated, including formation layering, well positioning, fracture modeling, treatment planning, and any acquired measurements suitable for setting boundary conditions. In block 704, the simulator module discretizes the volume and fracture geometry to generate an initial mesh, which is then used to construct sparse matrices representing the relationships between the system elements. Depending on the model structure, the sparse matrices may embody a connection graph in which the graph nodes may represent positions along the fracture paths, formation blocks, and model boundaries of the deformed mesh, while the graph edges represent the interactions (multi-phase mass flows, heat flows, and forces) between the graph nodes. For guidance on deriving the model and linear equations from the mesh representation, see Bai and Lin, "Tightly coupled fluid-structure interaction computation algorithm for hydraulic fracturing simulations", $48^{th}$ US Rock Mechanics Symposium Minneapolis, 2014 (ARMA 14-7258). Other model structures may alternatively be employed.

In block 706, a time index for a loop including blocks 706-716 is initialized and, in subsequent iterations, updated. In block 708 the simulator module solves the linear system of equations embodied by the sparse matrices. The information obtained from the solution enables the simulation module to determine whether any of the fractures have lengthened or branched, and if so, the direction and extent of the new segment. For each of the segments that have reached beyond the current end point by at least some minimum threshold, the simulator module assigns a new end point and displaces the nearest connected mesh node to that position in block 710.

In block 712, the simulator module applies meshless interpolation to deform the remaining mesh nodes based on the fixed nodes (along the fracture paths) and the constrained nodes (along the boundaries). This newly deformed mesh will be employed for simulating the next time step, and accordingly in block 714 the simulator module constructs the new matrix equations based on the new mesh geometry.

In block 716, the simulator module determines whether the last time step has been reached, and if not, the blocks 706-716 are repeated to move the simulation forward. After completion, the fracture geometry and other information is stored in block 718 and displayed by the visualization module. Analysis of the results may be applied to ongoing or future fracturing operations to adjust the injection fluid compositions, flow rates, volumes, etc. as needed to achieve the desired fracturing results.

In contrast with the static mesh approach that requires the fracture path to conform to the initial mesh, thereby reducing the influence of the physical phenomena, the deforming mesh approach described herein enables the fracture path to be modeled independently of the initial mesh, properly accounting for the physical phenomena and providing a more accurate representation. Furthermore, the original mesh connectivity is maintained and no additional unknowns are introduced, minimizing changes to the model infrastructure and computational complexity.

In summary, the embodiments disclosed herein include:

A: A hydraulic fracturing simulation method that comprises: creating an initial mesh representation of a subterranean formation, the mesh including mesh nodes; determining one or more fracture paths in the formation; for each of the one or more fracture paths, displacing a subset of the mesh nodes into alignment with the fracture path; interpolating from displacements of the aligned mesh nodes to obtain displacements for each non-aligned mesh node in the mesh, thereby obtaining a deformed mesh representation of the formation; using the deformed mesh to construct a linear set of equations representing fracture creation and propagation caused by injection of a hydraulic fracturing fluid; deriving one or more fracture path extensions from the linear set of equations; and displaying the one or more fracture paths with the one or more fracture path extensions.

B: A hydraulic fracturing simulation system that comprises: a data acquisition module collecting measurements from a subterranean formation; a processing module implementing a hydraulic fracturing simulation method; and a visualization module that displays one or more fracture paths with one or more fracture path extensions. The method implemented by the processing module comprises: creating an initial mesh representation of the subterranean formation based on the measurements, the mesh including mesh nodes; determining the one or more fracture paths in the formation; for each of the one or more fracture paths, displacing a subset of the mesh nodes into alignment with the fracture path; interpolating from displacements of the aligned mesh nodes to obtain displacements for each non-aligned mesh node in the mesh, thereby obtaining a deformed mesh representation of the formation; using the deformed mesh to construct a linear set of equations representing fracture creation and propagation caused by injection of a hydraulic fracturing fluid; and deriving the one or more fracture path extensions from the linear set of equations.

Each of the embodiments A and B, may further include one or more of the following additional features in any combination: (1) the method further includes storing the one or more fracture paths with the one or more fracture path extensions on a non-transitory computer-readable medium. (2) at least some of the mesh nodes are boundary nodes, and said interpolating constrains displacements of the boundary nodes to maintain the boundary nodes on a predetermined boundary. (3) said interpolating employs an interpolant comprising a linear combination of radial basis functions. (4) the interpolant further comprises an offset function. (5) the radial basis functions have the form of a thin plate spline.

(6) The method further includes: for each of the one or more fracture path extensions, aligning a previously non-aligned mesh node with the fracture path extension; and performing said interpolating, using, and deriving to forward a simulation of fracture propagation. (7) The method further includes iteratively repeating said aligning and performing to predict a result of a hydraulic fracturing operation. (8) the one or more previously non-aligned mesh nodes are each directly connected to a previously aligned mesh node. (9) the aligned mesh nodes are directly connected along the fracture path.

Numerous variations and modifications will become apparent to those skilled in the art once the above disclosure is fully appreciated. The ensuing claims are intended to cover such variations where applicable.

What is claimed is:

1. A hydraulic fracturing simulation method that comprises:
    creating an initial mesh representation of a subterranean formation, the mesh including mesh nodes;
    determining one or more fracture paths in the formation;
    for each of the one or more fracture paths, displacing a subset of the mesh nodes to move edges between the subset of the mesh nodes into alignment with the fracture path without modifying an existing connectivity of the mesh;
    interpolating from displacements of the aligned mesh nodes to obtain displacements for each non-aligned mesh node in the mesh, thereby obtaining a deformed mesh representation of the formation;
    using the deformed mesh to construct a linear set of equations representing fracture creation and propagation caused by injection of a hydraulic fracturing fluid;
    deriving one or more fracture path extensions from the linear set of equations;
    for an end point of the fracture path extensions that has moved beyond a threshold, displacing one of the mesh nodes, which is closest to the end point, to a position of the end point; and
    displaying the one or more fracture paths with the one or more fracture path extensions.

2. The method of claim 1, further comprising storing the one or more fracture paths with the one or more fracture path extensions on a non-transitory computer-readable medium.

3. The method of claim 1, wherein at least some of the mesh nodes are boundary nodes, and wherein said interpolating constrains displacements of the boundary nodes to maintain the boundary nodes on a predetermined boundary.

4. The method of claim 1, wherein said interpolating employs an interpolant comprising a linear combination of radial basis functions.

5. The method of claim 4, wherein the interpolant further comprises an offset function.

6. The method of claim 4, wherein the radial basis functions have the form of a thin plate spline.

7. The method of claim 1, further comprising:
    for each of the one or more fracture path extensions, aligning a previously non-aligned mesh node with the fracture path extension; and
    performing said interpolating, using, and deriving to forward a simulation of fracture propagation.

8. The method of claim 7, further comprising iteratively repeating said aligning and performing to predict a result of a hydraulic fracturing operation.

9. The method of claim 7, wherein the one or more previously non-aligned mesh nodes are each directly connected to a previously aligned mesh node.

10. The method of claim 1, wherein the aligned mesh nodes are directly connected along the fracture path.

11. A hydraulic fracturing simulation system that comprises:
    a data acquisition module collecting measurements from a subterranean formation;
    a processing module implementing a hydraulic fracturing simulation method that includes:
        creating an initial mesh representation of the subterranean formation based on the measurements, the mesh including mesh nodes;
        determining one or more fracture paths in the formation;
        for each of the one or more fracture paths, displacing a subset of the mesh nodes to move edges between the subset of the mesh nodes into alignment with the fracture path without modifying an existing connectivity of the mesh;
        interpolating from displacements of the aligned mesh nodes to obtain displacements for each non-aligned mesh node in the mesh, thereby obtaining a deformed mesh representation of the formation;
        using the deformed mesh to construct a linear set of equations representing fracture creation and propagation caused by injection of a hydraulic fracturing fluid;
        deriving one or more fracture path extensions from the linear set of equations; and
        for an end point of the fracture path extensions that has moved beyond a threshold, displacing one of the mesh nodes, is closest to the end point, to a position of the end point; and
    a visualization module that displays the one or more fracture paths with the one or more fracture path extensions.

12. The system of claim 11, wherein the method further comprises storing the one or more fracture paths with the one or more fracture path extensions on a non-transitory computer-readable medium.

13. The system of claim 11, wherein at least some of the mesh nodes are boundary nodes, and wherein said interpolating constrains displacements of the boundary nodes to maintain the boundary nodes on a predetermined boundary.

14. The system of claim 11, wherein said interpolating employs an interpolant comprising a linear combination of radial basis functions.

15. The system of claim 14, wherein the interpolant further comprises an offset function.

16. The system of claim 14, wherein the radial basis functions have the form of a thin plate spline.

17. The system of claim 11, wherein the method further comprises:
    for each of the one or more fracture path extensions, aligning a previously non-aligned mesh node with the fracture path extension; and
    performing said interpolating, using, and deriving to forward a simulation of fracture propagation.

18. The system of claim 17, wherein the method further comprises iteratively repeating said aligning and performing to predict a result of a hydraulic fracturing operation.

19. The system of claim 17, wherein the one or more previously non-aligned mesh nodes are each directly connected to a previously aligned mesh node.

20. The system of claim 11, wherein the aligned mesh nodes are directly connected along the fracture path.

* * * * *